United States Patent
Katz et al.

(10) Patent No.: US 11,961,820 B2
(45) Date of Patent: Apr. 16, 2024

(54) METHOD FOR PRODUCING A CONNECTION BETWEEN COMPONENT PARTS, AND COMPONENT MADE OF COMPONENT PARTS

(71) Applicant: OSRAM OLED GmbH, Regensburg (DE)

(72) Inventors: Simeon Katz, Regensburg (DE); Mathias Wendt, Hausen (DE); Sophia Huppmann, Geldersheim (DE); Marcus Zenger, Hausen (DE); Jens Mueller, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 25 days.

(21) Appl. No.: 16/768,208

(22) PCT Filed: Feb. 5, 2019

(86) PCT No.: PCT/EP2019/052781
§ 371 (c)(1),
(2) Date: May 29, 2020

(87) PCT Pub. No.: WO2019/158401
PCT Pub. Date: Aug. 22, 2019

(65) Prior Publication Data
US 2020/0294962 A1    Sep. 17, 2020

(30) Foreign Application Priority Data
Feb. 15, 2018  (DE) .......................... 102018103431.8

(51) Int. Cl.
*H01L 23/00* (2006.01)
*H01L 33/62* (2010.01)

(52) U.S. Cl.
CPC .............. *H01L 24/89* (2013.01); *H01L 24/05* (2013.01); *H01L 24/08* (2013.01); *H01L 33/62* (2013.01);
(Continued)

(58) Field of Classification Search
CPC ..................... H01L 24/08; H01L 24/04; H01L 2224/08237; H01L 2224/05571;
(Continued)

(56) References Cited

U.S. PATENT DOCUMENTS 6,635,969 B1 * 10/2003 Nakamura .......... H01L 25/0657
257/777
6,643,434 B2 * 11/2003 Cayrefourcq ........ G02B 6/4232
257/E21.705
(Continued)

FOREIGN PATENT DOCUMENTS

CN        1634762 A  *  7/2005
CN      104875440 B  *  1/2017
(Continued)

OTHER PUBLICATIONS

Invensas, "DBI," https://www.invensas.com/technologies/dbi, May 29, 2020, pp. 1-3.

*Primary Examiner* — David A Zarneke
(74) *Attorney, Agent, or Firm* — Slater Matsil, LLP (57) ABSTRACT

A method for producing a connection between component parts and a component made of component parts are disclosed. In an embodiment, a includes providing a first component part having a first exposed insulation layer and a second component part having a second exposed insulation layer, wherein each of the insulation layers has at least one opening, joining together the first and second component parts such that the opening of the first insulation layer and the opening of the second insulation layer overlap in top
(Continued)

view, wherein an Au layer and a Sn layer are arranged one above the other in at least one of the openings and melting the Au layer and the Sn layer to form an AuSn alloy, wherein the AuSn alloy forms a through-via after cooling electrically conductively connecting the first component part to the second component part.

15 Claims, 9 Drawing Sheets

(52) U.S. Cl.
CPC .............. *H01L 2224/05166* (2013.01); *H01L 2224/05169* (2013.01); *H01L 2224/05582* (2013.01); *H01L 2224/05611* (2013.01); *H01L 2224/05644* (2013.01); *H01L 2224/08111* (2013.01); *H01L 2224/08146* (2013.01); *H01L 2224/08502* (2013.01); *H01L 2224/80805* (2013.01); *H01L 2224/80895* (2013.01); *H01L 2224/80896* (2013.01); *H01L 2924/12041* (2013.01); *H01L 2933/0066* (2013.01)

(58) Field of Classification Search
CPC ..... H01L 2224/08111; H01L 24/08111; H01L 24/15–17; H01L 2924/15153–15157
See application file for complete search history.

(56) References Cited

U.S. PATENT DOCUMENTS

| | | | |
|---|---|---|---|
| 6,756,305 B1* | 6/2004 | Conn | H01L 24/11 257/E23.021 |
| 6,909,194 B2* | 6/2005 | Farnworth | H01L 24/13 257/734 |
| 7,221,048 B2 | 5/2007 | Daeche et al. | |
| 8,198,131 B2* | 6/2012 | Weng | H01L 21/56 257/E31.127 |
| 8,564,969 B2* | 10/2013 | Oppermann | H01L 25/0657 361/790 |
| 9,040,351 B2* | 5/2015 | Kwon | H01L 24/83 438/109 |
| 9,085,457 B2* | 7/2015 | Heald | B81C 1/00269 |
| 9,105,771 B2 | 8/2015 | Weidner et al. | |
| 9,142,517 B2* | 9/2015 | Liu | H01L 23/53295 |
| 9,394,161 B2* | 7/2016 | Cheng | B81C 1/00238 |
| 9,548,290 B2* | 1/2017 | Wakiyama | H01L 25/0657 |
| 9,679,867 B2* | 6/2017 | Ashidate | H01L 27/14634 |
| 9,761,463 B2* | 9/2017 | Tanida | H01L 24/03 |
| 9,935,072 B2* | 4/2018 | Jeong | H01L 24/73 |
| 9,953,941 B2* | 4/2018 | Enquist | H01L 21/50 |
| 9,978,715 B2* | 5/2018 | Huang | H01L 23/49816 |
| 10,121,762 B2* | 11/2018 | Chen | H01L 24/05 |
| 10,361,342 B2 | 7/2019 | Chen et al. | |
| 10,446,774 B2* | 10/2019 | Hong | H01L 21/768 |
| 10,505,091 B2 | 12/2019 | von Malm et al. | |
| 10,541,230 B2* | 1/2020 | Higuchi | H01L 23/481 |
| 10,796,913 B2* | 10/2020 | Lin | H01L 24/08 |
| 11,195,748 B2* | 12/2021 | Uzoh | H01L 24/82 |
| 11,244,916 B2* | 2/2022 | Uzoh | H01L 25/0657 |
| 11,264,345 B2* | 3/2022 | Enquist | H01L 25/50 |
| 2001/0032985 A1* | 10/2001 | Bhat | H01L 33/405 257/E33.068 |
| 2004/0157407 A1* | 8/2004 | Tong | H01L 25/50 257/E21.705 |
| 2007/0111386 A1* | 5/2007 | Kim | H01L 21/76804 257/E21.705 |
| 2008/0064214 A1* | 3/2008 | Han | H01L 21/3105 257/E21.241 |
| 2008/0070354 A1* | 3/2008 | Jain | H01L 21/02532 438/172 |
| 2012/0288995 A1 | 11/2012 | El-Ghoroury et al. | |
| 2014/0041548 A1* | 2/2014 | Lang | C04B 35/62625 106/287.34 |
| 2016/0336307 A1* | 11/2016 | Herrmann | H01L 23/49822 |

FOREIGN PATENT DOCUMENTS

| | | |
|---|---|---|
| DE | 10235332 A1 | 2/2004 |
| DE | 102010034565 A1 | 2/2012 |
| DE | 102014100773 A1 | 7/2015 |
| DE | 102015109755 A1 | 12/2016 |
| DE | 102017114215 A1 | 12/2017 |
| WO | 2017035321 A1 | 3/2017 |

* cited by examiner

METHOD FOR PRODUCING A CONNECTION BETWEEN COMPONENT PARTS, AND COMPONENT MADE OF COMPONENT PARTS

This patent application is a national phase filing under section 371 of PCT/EP2019/052781, filed Feb. 5, 2019, which claims the priority of German patent application 102018103431.8, filed Feb. 15, 2018, each of which is incorporated herein by reference in its entirety.

TECHNICAL FIELD

A method for establishing a connection, in particular a mechanical and at the same time electrical connection between two or a plurality of component parts, is specified. Furthermore, a component made of component parts is specified.

BACKGROUND

In the manufacture of a pixelated LED or an LED radiating in several colors, it is often the case that several functional layers are stacked on top of each other and are individually contacted. Here, the direct bonding process can be used for the mechanical fixing of the component parts and for the contacting of functional layers of the component parts, for example, using metallic contact posts. In a direct bonding process, the surfaces of the component parts should be planarized as best as possible. The metallic posts should be moved back from the planarized surfaces of the component parts in order not to interfere with the direct bonding process. On the other hand, the metallic posts should not be moved back too far, as otherwise the contact between the metallic posts will not close during a subsequent annealing step. Altogether, for a planarization process, there is only a relatively narrow process window.

SUMMARY OF THE INVENTION

Embodiments provide a simplified and cost-efficient method for producing a mechanical and/or electrical connection between different component parts. Further embodiments provide a compact and mechanically stable component having a stable and reliable electrical connection between the component parts.

According to at least one embodiment of the method, an electrical connection is established between a first component part and a second component part. Preferably, the establishment of the electrical connection between the component parts is carried out simultaneously with a mechanical fixing between the component parts or only after the establishment of a mechanical connection between the component parts.

A first component part is provided which has a first, in particular exposed insulation layer. A second component part is provided, wherein the second component part has a second, in particular exposed insulation layer. Each of the insulation layers can have at least one opening or a plurality of openings arranged next to each other. In the openings of the first and/or the second insulation layer, connecting stacks may be arranged. The respective connecting stack may have a plurality of layers, in particular electrically conductive layers, arranged one above the other. In particular, the connecting stack is formed from layers which preferably comprise a solder material such as gold or tin. For example, at least 50, 60, 70, 80, 90 or 95 percent by volume and/or weight of the connecting stack is made up of solder materials such as gold and tin. The connecting stack may be free of layers such as copper and/or nickel.

According to at least one embodiment of the method, the component parts are joined together such that the opening of the first insulation layer and the opening of the second insulation layer overlap in top view. In at least one or in each of the openings of the first insulation layer and/or the second insulation layer, a connecting stack may be arranged. In particular, the connecting stack comprises a gold layer and a tin layer which are arranged one above the other. It is possible for a barrier layer to be arranged vertically between the gold layer and the tin layer.

A vertical direction is understood to mean a direction which is in particular perpendicular to a main extension surface of the first and/or of the second insulation layer. A lateral direction is understood to mean a direction which is in particular parallel to the main extension surface of the first and/or of the second insulation layer. The vertical direction and the lateral direction are in particular orthogonal to each other.

According to at least one embodiment of the method, the connecting stack has a protective layer which is arranged on the gold layer or on the tin layer. When the component parts are joined together, the opening of the first insulation layer and the corresponding opening of the second insulation layer can form a closed intermediate space, such as a common closed cavity. In the common cavity, a first connecting stack and a second connecting stack can be arranged opposite each other, wherein the first connecting stack and the second connecting stack are arranged for instance in the opening of the first insulation layer and in the opening of the second insulation layer, respectively. After the component parts have been joined together, the first insulation layer may be directly adjacent to the second insulation layer. However, the first connecting stack can still be spaced apart from the second connecting stack by an intermediate space.

According to at least one embodiment of the method, the gold layer and the tin layer are melted to form a gold-tin alloy. After cooling, the gold-tin alloy can form a through-via which connects the first component part with the second component part in an electrically conductive manner. The gold layer and the tin layer can be assigned to the first and/or the second connecting stack. For forming the through-via, both the first connecting stack and the second connecting stack can be melted.

In particular prior to the melting, the first connecting stack and the second connecting stack are not in direct physical contact. During melting, the volume of the respective connecting stack, especially the total volume of the gold layer and of the tin layer, increases. In the liquid phase, the connecting stacks expand and come into direct physical contact. After cooling, the molten connecting stacks form a through-via which is formed in one piece and connects the first component part with the second component part in an electrically conductive manner.

In at least one embodiment of the method for producing an electrical connection between a first component part and a second component part, the first component part having a first exposed insulation layer and the second component part having a second exposed insulation layer are provided, wherein the insulation layers each have at least one opening. The component parts are joined together such that the opening of the first insulation layer and the opening of the second insulation layer overlap in top view. In at least one of the openings or in each of the openings, a gold layer and a tin layer are arranged one above the other. The gold layer and the tin layer are melted to form a gold-tin alloy, wherein after cooling, the gold-tin alloy forms a through-via which connects the first component part to the second component part in an electrically conductive manner.

Preferably, the component parts are joined together and fixed by a direct bonding process. As a result, a firm mechanical connection between the component parts can be established even before the connecting stack, in particular the gold layer and the tin layer, is melted. In a direct bonding process, planarized surfaces, in particular the surfaces of the insulation layers, are brought into physical contact. The mechanical bond is mainly or exclusively based on hydrogen bonds and/or Van-der-Waals interactions in the immediate vicinity of a common interface between the planarized surfaces. For forming covalent bonds between atoms or molecules on the surfaces standing in physical contact, for example, a thermal treatment is applied subsequently to achieve increased bond strength. In particular, the electrical connection between the component parts only takes place during or after the formation of the through-via.

The method described here particularly relates to a direct bonding process, wherein the through-vias are preferably formed from a gold-tin alloy or essentially from a gold-tin alloy. The electrical connection of the functional layers of the component parts is realized in particular by melting the gold and tin layer in a subsequent annealing step. Using this approach, a wider process window can be guaranteed. In comparison with conventional processes, wherein the through-vias are formed from a metal or predominantly formed, i.e., more than 50% by volume and/or weight, from a metal such as nickel or copper, the gold-tin alloy connecting stack can be easily adjusted so that it is retracted very precisely over a predetermined distance from a direct bond interface so that during the annealing step, on the one hand it results in the formation of the through-vias but on the other hand does not result in delamination of the direct bond interface.

According to at least one embodiment of the method, the first insulation layer and the second insulation layer each have a planarized exposed surface outside the openings. The planarized exposed surface has a roughness which is in particular 500 nm, 30 nm, 20 nm, 10 nm or 5 nm at most. The first component part and the second component part are preferably mechanically bonded together by a direct bonding process at a common interface between the planarized surfaces of the component parts. In particular, the common interface is free of any joining material, such as solder or adhesion promoter material. The common interface is in particular an overlapping surface between the planarized exposed surfaces of the insulation layers which arises during the joining process.

According to at least one embodiment of the method, the component parts are mechanically joined together during the joining process. The step of melting the gold layer and/or the tin layer or the connecting stacks in particular follows the step of mechanically joining the component parts. In other words, the electrical connection is made after the mechanical connection between the component parts has been formed.

According to at least one embodiment of the method, the gold layer and the tin layer are integral parts of the connecting stack. The connecting stack has an overall vertical height that is less than a vertical depth of the associated opening in which the connecting stack is located. In addition to the gold layer and/or the tin layer, the connecting stack may have other layers, such as a barrier layer and/or a protective layer. Preferably, the other layers of the layer stack, such as the protective layer and the barrier layer, are formed from an electrically conductive material.

If the total vertical height of the connecting stack is less than the vertical depth of the associated opening, the connecting stack is located completely within the opening. In particular, along the vertical direction, the connecting stack does not protrude above the surface of the associated insulation layer. In this sense, the connecting stack is retracted a predetermined distance from the surface of the insulation layer, in particular from the direct bond interface. For example, the predetermined distance is between 1 nm and 1 µm inclusive, preferably between 1 nm and 500 nm, for instance between 1 nm and 100 nm inclusive, or between 1 nm and 50 nm inclusive. The total vertical height of the connecting stack and the total depth of the opening may differ by at least 1 nm and at most by 100 nm, 300 nm or 1 µm.

According to at least one embodiment of the method, a first opening of the first insulation layer and a second opening of the second insulation layer form a common closed cavity when the component parts are joined together. In each of the first and second openings, a connecting stack comprising at least a gold layer and a tin layer can be arranged. It is possible for the first insulation layer to have a plurality of first openings and/or for the second insulation layer to have a plurality of second openings. It is also possible that a plurality of sealed cavities are formed when the component parts are joined together, wherein each sealed cavity is formed from a first opening of the first insulation layer and a second opening of the second insulation layer.

According to at least one embodiment of the method, prior to the melting, the connecting stacks arranged in the openings are spaced apart from each other by an intermediate space. A vertical spacing between the connecting stacks may be between 10 nm and 2 µm inclusive, for example between 50 nm and 500 nm inclusive, or between 20 nm and 100 nm inclusive. In particular, the connecting stacks are in direct mechanical contact with each other at first only during or after the melting process.

During the melting process, the total volume of the gold-tin alloy increases, as a result of which the intermediate space between the stacks is bridged by the material of the connecting stacks. After cooling, a through-via is formed from the connecting stack, as a result of which the through-via mechanically and electrically conductively connects the component parts with each other. It has been found that in a direct bonding process, an increase of the volume of about 4.5% during the conversion of pure tin and gold into an alloy having an eutectic composition is particularly suitable for forming of the through-via or of the plurality of through-vias. An AuSn connecting stack 3 µm in height melted at about 280° C. and, wherein the Au layer and the Sn layer are previously separated by a temporary diffusion barrier, would grow by about 135 nm while retaining its shape.

The connecting stacks are therefore preferably slightly retracted from the direct bond interface before melting, as a result of which the risk of delamination of the direct bond interface is minimized. Gold and tin can be used to precisely and reliably adjust an optimum distance of the connecting stack from the planarized surface of the insulation layer or from the direct bond interface. In addition, the thermal treatment for melting the gold and tin layer can be carried out very reliably, since the melting temperature of the AuSn alloy is precisely defined and can be kept constant over all component parts. This is not the case in a direct bond interconnection (DBI) using metal posts made of copper or nickel, since compared to the material in which the metal posts are embedded, effect of higher thermal expansion of the metal posts is used. Variations in the distances of the metal posts to the bonding surface result in different temperatures which are necessary to bring the metal posts into contact and to form the electrical contact. In total, compared to Cu and/or Ni contact posts, a larger process window can be achieved when using AuSn posts.

According to at least one embodiment of the method, a barrier layer is arranged in the vertical direction at least in places between the gold layer and the tin layer. The barrier layer is preferably made of a material whose melting temperature is higher than that of gold and/or tin. The barrier layer thus forms a temporary diffusion barrier between the gold layer and the tin layer. Using the barrier layer, an undesired early intermetallic reaction can be avoided, since the increase in volume should preferably start only after the adjusted bonding of the component parts. In particular, the increase in volume should occur only after the adjusted bonding and the subsequent heating and melting of the Au/Sn layer.

For example, the gold layer is separated from the tin layer only by the barrier layer. It is possible that the barrier layer is formed such that it completely encloses the gold layer and/or the tin layer at least in lateral directions. It is also conceivable that the barrier layer is arranged along the vertical direction between the protective layer and the gold layer and/or the tin layer. An early reaction, especially an early intermetallic reaction between the protective layer and the gold layer and/or the tin layer can thus be avoided. The barrier layer preferably comprises titanium or platinum or consists of titanium and/or platinum.

According to at least one embodiment of the method, before joining together the component parts, the gold layer and the tin layer are covered by a particularly exposed protective layer. The protective layer is preferably formed from a material whose mechanical hardness is greater than that of tin or of gold and tin. The protective layer may be made of a metal, for example of gold, copper, nickel, titanium or aluminum. It is also possible that the protective layer is a combination of different metals, for example a combination of gold, copper, nickel, titanium and/or aluminum.

According to at least one embodiment of the method, the first component part or the second component part is a wafer carrier, a semiconductor wafer, a carrier, an electronic or an optoelectronic component part such as a semiconductor chip, a control element or a component part having at least one carrier, a main body and a contact structure. The through-via represents in particular an electrical connection between the contact structures of the component parts. The contact structure of the respective component part can have a plurality of contact layers, for example at least two contact layers, which are assigned to different electrical polarities of the component part. In particular, the through-via connects a contact layer or a contacting structure of a first component part with a contact layer or a contacting structure of a second component part. The main body of the respective component part can be a semiconductor body or a control structure having transistors. The main body may comprise a light-emitting or a light-detecting semiconductor body and/or electrical circuit elements.

According to at least one embodiment of a component, it comprises a first component part having a first insulation layer and a second component part having a second insulation layer. The first component part is preferably electrically conductively connected to the second component part via a through-via, wherein the through-via extends throughout the first insulation layer and the second insulation layer.

In particular, the first insulation layer directly adjoins the second insulation layer. Preferably, the first component part is mechanically connected to each other at a common interface between the insulation layers. An electrical connection between the component parts is established via the through-via which extends throughout the common interface between the insulation layers. In particular, the through-via also forms a mechanical connection between the component parts. The common interface between the insulation layers is in particular free of a connecting material, for example free of a solder material or free of an adhesion promoter material. The first insulation layer is mechanically connected to the second insulation layer, in particular by using a direct bonding process. The through-via is made in particular in one piece.

In at least one embodiment of the component, it has a first component part, a second component part and a through-via. The through-via is in particular a gold-tin alloy which connects the first component part with the second component part in an electrically conductive manner. The first component part has a first insulation layer and the second component part has a second insulation layer, wherein the through-via is arranged in a first opening of the first insulation layer and in a second opening of the second insulation layer. The through-via can thus be located partly within the first opening and partly within the second opening. In the lateral directions, the through-vias can be completely enclosed by both the first insulation layer and the second insulation layer.

According to at least one embodiment of the method or of the component, the first component part or the second component part is a radiation-inactive carrier wafer. In particular, the first component part or the second component part is not configured for generating electromagnetic radiation or for detecting electromagnetic radiation. Alternatively, the first component part or the second component part may be a semiconductor wafer comprising, for example, a semiconductor body having a radiation-active layer. The radiation-active layer is configured in particular to generate or detect electromagnetic radiation. For example, the radiation-active layer is configured to generate electromagnetic radiation in the UV-IR—or in the visible spectral range, for example in the blue, yellow or yellow spectral range.

It is possible that the first component part is a radiation-inactive carrier wafer and the second component part is a semiconductor wafer having a radiation-active layer. It is possible that the first component part is a radiation-inactive carrier wafer which is in particular a carrier body, and the second component part is a semiconductor chip. The component may have a plurality of second component parts which are arranged on the first component part and are mechanically and electrically connected to it. The second component parts may be semiconductor chips which are configured for generating and/or detecting electromagnetic radiation. The plurality of second component parts may be semiconductor chips fixed side by side on the first component part. For example, the second component parts may be fixed on the first component part and electrically contacted therewith either simultaneously or consecutively.

According to at least one embodiment of the method or of the component, the first insulation layer is formed from silicon oxide, in particular from silicon dioxide. The second insulation layer may be formed from silicon oxide, in particular from silicon dioxide. The first insulation layer and/or the second insulation layer can be formed from silicon dioxide or consist of silicon dioxide. Insulation layers made of silicon oxide are particularly suitable for the direct bonding process. In addition, silicon oxide insulation layers can withstand high temperatures, such as temperatures around 280° C. or higher, at which the gold layer and tin layer are fused to form a gold-tin alloy layer.

According to at least one embodiment of the method or of the component, an opening of the first insulation layer and an opening of the second insulation layer form a common closed cavity. The cavity may, at least in places, have a greater lateral extent than the through-via. In this case, the through-via fills the cavity only partially. There may be intermediate spaces in the lateral directions between the through-via and the inner walls of the cavity. The intermediate spaces can be filled with a gaseous medium such as air. These spaces can be filled with a gaseous medium, such as air, to provide space for excess solder material, which in this case may be the gold-tin alloy, so that no force is exerted on the direct bond interface during the formation of the through-via which could lead to delamination of the insulation layers.

Alternatively, it is possible that the amount of solder material is selected such that the resulting through-via completely fills the common closed cavity. In this case, the through-via can be immediately adjacent to the first insulation layer and/or to the second insulation layer. In lateral directions, the through-via can be completely surrounded by the first insulation layer and by the second insulation layer, wherein the insulation layers directly adjoin the through-via and can completely cover lateral surfaces of the contact.

According to at least one embodiment of the method or of the component, the through-via is formed in one piece. In particular, the through-via is a gold-tin eutectic. However, the through-via may show traces of materials of the barrier layer and/or of the protective layer. For example, the gold-tin eutectic shows traces of copper, nickel, titanium and/or aluminum. The through-via is preferably formed mainly from a gold-tin alloy, wherein the gold-tin alloy content may be at least 50, 60, 70, 80, 90 or at least 95% by weight or volume. It is possible that the through-via is free of metals such as copper and/or nickel or that the through-via has a copper and/or nickel content of at most 30, 20, 10, 5 or at most 3% by weight or volume.

The method described here is particularly suitable for the production of a component made of component parts described here. The features described in connection with the method can therefore also be used for the component, and vice versa.

BRIEF DESCRIPTION OF THE DRAWINGS

Other preferred embodiments and further developments of the component and of the method will become apparent in the exemplary embodiments explained.

DETAILED DESCRIPTION OF ILLUSTRATIVE EMBODIMENTS

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

Figure 1A:
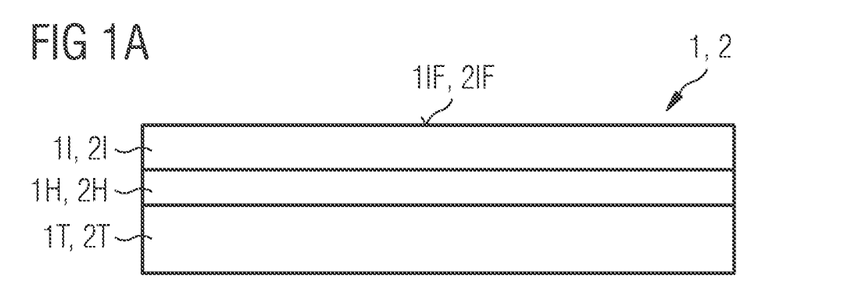
FIGS. 1A, 1B, 1C, 1D, 1E, 1F and 1G show an embodiment of a method for forming a mechanical and electrical connection between the component parts in schematic sectional views.

FIG. 1A schematically shows a first component part 1 and a second component part 2 in sectional view. The component part 1 or 2 has a carrier 1T or 2T. The component part 1 or 2 has a first insulation layer 1I or a second insulation layer 2I, wherein the insulation layer 1I or 2I is located on the carrier 1T or 2T. The component part 1 or 2 may have a main body 1H or 2H, wherein the main body 1H or 2H is disposed in the vertical direction between the carrier 1T or 2T and the insulation layer 1I or 2I.

The second component part 2 may be a semiconductor wafer. In particular, the component part 2 can have a carrier 2T, for example made of sapphire, on which the main body 2H, which is in particular a semiconductor body, is arranged. The main body 2H can be applied to the carrier 2T by an epitaxial process, wherein the carrier 2T is in particular a growth substrate. The main body 2H may have a semiconductor body which is based, for example, on a III-V or on a II-VI compound semiconductor material. In particular, the main body 2H has a radiation-active layer 23 which is configured to generate or detect electromagnetic radiation during operation of the component part 2 (FIG. 1F). The radioactive layer 23 can be a p-n-junction. The main body 2H may have further semiconductor layers which are for example intrinsic, p-doped or n-doped. In particular, the radiation-active layer 23 of the main body 2H is arranged in the vertical direction between a first semiconductor layer and a second semiconductor layer, wherein the first semiconductor layer is arranged on the n-side and the second semiconductor layer is arranged on the p-side, or vice versa. In particular, the main body 2H forms a diode structure comprising the semiconductor layers and the radiation-active layer 23. The second component part 2 can be an LED.

The component part 2 may have a contact structure 2K (FIG. 1F) which is arranged in the vertical direction in particular between the main body 2H and the insulation layer 2I. The contact structure 2K is configured in particular for electrically contacting the main body 2H.

The first component part 1 can be formed analogously to the second component part 2. It is also possible that the first component part 1 is formed as a radiation-inactive wafer carrier. The main body 1H can be free of a radiation-active layer. The main body 1H can be formed as an etch stop layer and/or as a starting layer for electroplating further layers on the main body 1H. The carrier 1T can be a Si wafer. The first component part 1 can have a contact structure 1K (FIG. 1F) which is arranged in the vertical direction between the first insulation layer 1I and the first main body 1H. The first contact structure 1K and the second contact structure 2K are not shown in FIG. 1A, but may be formed similar to the exemplary embodiments shown in FIGS. 1F, 4A and 4C.

Figure 1B:
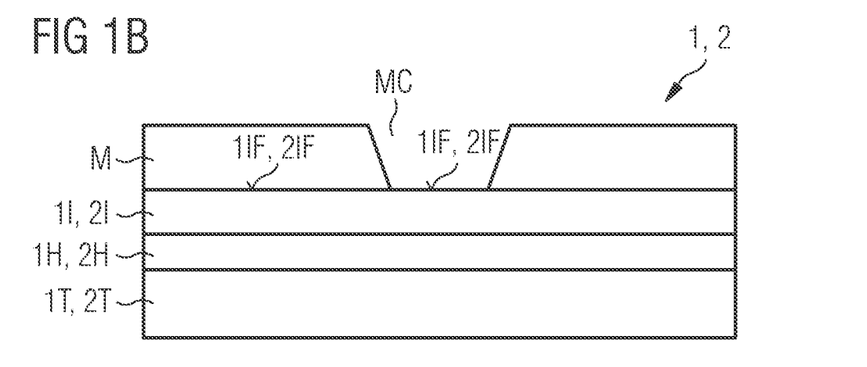

According to FIG. 1B, a mask M is formed on the insulation layer 1I or 2I. The mask M can be formed from a resist layer, in particular from a photo-structurable resist layer. The mask M has at least one opening MC or a plurality of openings MC. In the opening MC or in the openings MC, a surface 1IF or 2IF of the first insulation layer 1I or of the second insulation layer 2I is exposed in places.

Figure 1C:
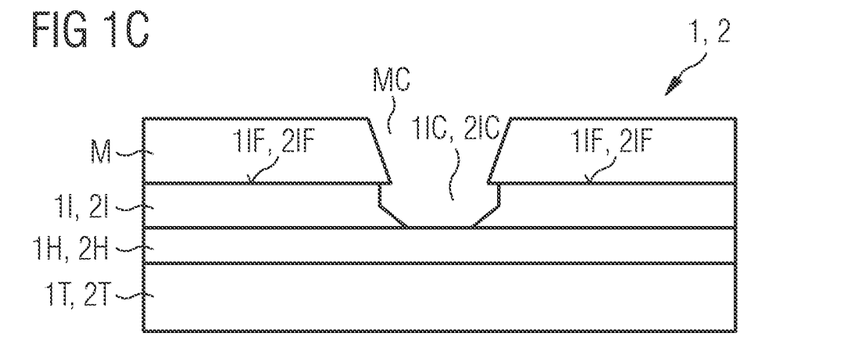

According to FIG. 1C, the openings 1IC and 2IC of the first or of the second insulation layer 1I or 2I are formed in the areas of the openings MC of the mask M, for example, by applying an etching process. In the openings 1IC or 2IC of the insulation layer 1I or 2I, the contact layers of the contact structure 1K or 2K can be freely accessible in places. At an interface between the mask M and the insulation layer 1I or 2I, the openings 1IC or 2IC can have a larger cross-section than the associated opening MC of the mask M. Along a lateral direction, the mask M may protrude beyond an inner wall of the opening 1IC or 2IC in places and thus partially cover the opening 1IC or 2IC in top view.

Figure 1D:
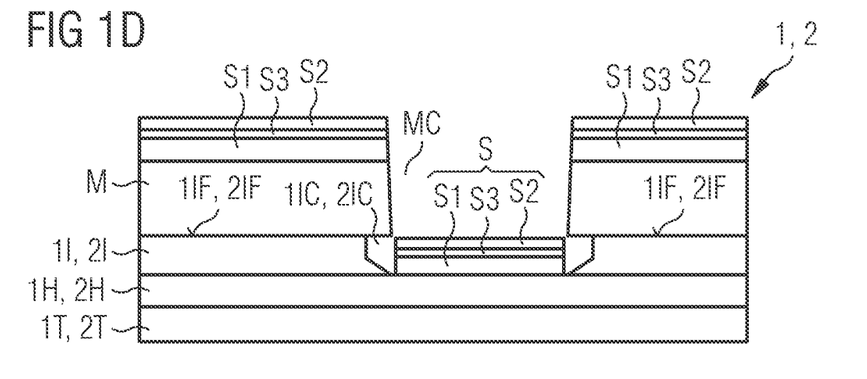

As shown in FIG. 1D, a connecting stack S is applied onto the component part 1 or 2 in layers and in particular in a flat manner over a large area. The connecting stack S may have a first layer S1, a second layer S2 and a layer S3 between the first and second layers. The first layer S1 is in particular a gold layer. The second layer S2 is in particular a tin layer. It is possible that the first layer S1 is a tin layer and that the second layer S2 is a gold layer. The third layer S3 is in particular a barrier layer S3 which is formed from titanium or platinum, for example.

The connecting stack S is located within the opening 1IC or 2IC of the first or second insulation layer 1I or 2I. In lateral directions, the connecting stack S is in particular completely surrounded by the first insulation layer 1I or by the second insulation layer 2I. As shown in FIG. 1D, there is a lateral intermediate space, in particular between the connecting stack S and the insulation layer 1I or 2I. This intermediate space can completely surround the connecting stack S in lateral directions. The intermediate space is formed for instance in that area of the opening 1IC or 2IC which is covered by the mask M in top view. The intermediate space can be formed since at a common interface between the mask M and the insulation layer 1I or 2I, the opening 1IC or 2IC has a larger lateral cross-section than the opening MC of the mask M. When the connecting stack S is applied, the intermediate space is not covered by the layers S1 to S3 so that the intermediate space is not filled by material of the connecting stack S.

Figure 1E:
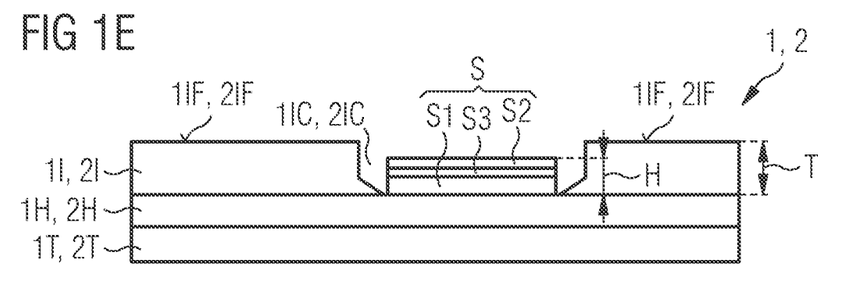
Figure 1F:
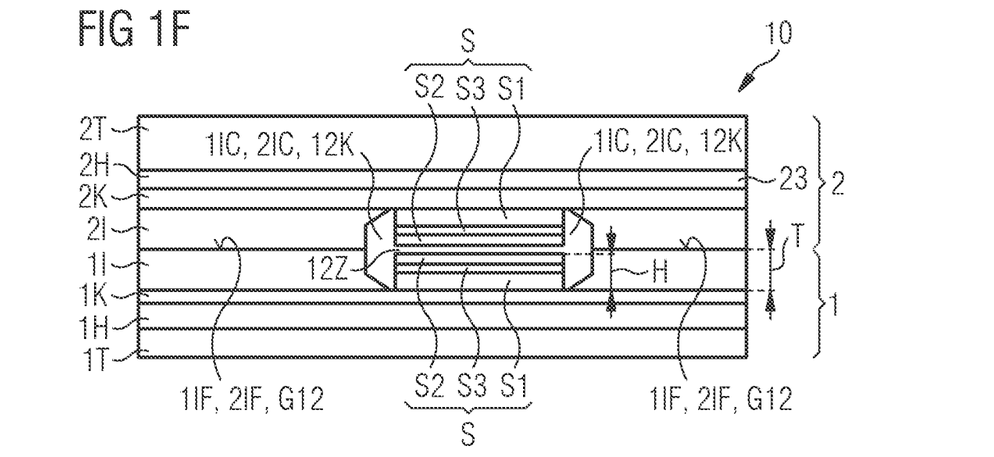

As shown in FIG. 1E, outside the openings 1IC or 2IC, the mask M and the layers S1 to S3 are removed. A planarization process, especially a chemical-mechanical planarization process (CMP), is suitable for this purpose. The surface 1IF and/or 2IF of the first and/or second insulation layer is/are planarized by this process. In particular, the planarized surface 1IF or 2IF outside the openings 1IC or 2IC has a maximum roughness that is less than 100 nm, 50 nm, 30 nm, 20 nm or less than 10 nm.

Subsequent to the planarization process, the insulation layer 1I or 2I has a vertical layer thickness T. The vertical layer thickness T corresponds for instance to the total depth T of the opening or of the openings 1IC and/or 2IC. The connecting stack S is located completely within the corresponding opening 1IC or 2IC. In particular, the connecting stack S has an overall height H which is preferably smaller than the overall depth T of the opening or openings 1IC or 2IC. In particular, the total height H and the total depth T differ by at least 2 nm, 5 nm or 10 nm and at most 30 nm, 50 nm, 100 nm or 1 μm. As shown in FIG. 1E, the connecting stack H is thus slightly retracted from the planarized surface 1IF or 2IF.

As shown in FIG. 1F, the component parts 1 and 2 are joined together. In particular, the component parts 1 and 2 are mechanically joined at the common interface G12 of the first insulation layer 1I and of the second insulation layer 2I using a direct bonding process at normal room temperatures. The first component part 1 can be a radiation-inactive carrier wafer. The second component part 2 can be a radiation-active semiconductor wafer. The component part 2 has a main body 2H which in particular comprises a radiation-active layer 23. The first component part 1 can be free of such a radiation-active layer.

As shown in FIG. 1F, the openings 1IC and 2IC form a common, in particular closed cavity 12K when the component parts 1 and 2 are joined together. The connecting stack S of the first component part 1 and of the connecting stack S of the second component part 2 are arranged in the common cavity 2K. Since the connecting stacks S are each retracted from the planarized surface 1IF or 2IF, there is an intermediate area 12Z or space 12Z in the vertical direction between the connecting stacks S. Due to the presence of the intermediate space 12Z, no electrical connection between component parts 1 and 2 is established, in particular even after the mechanical fixing of the component parts 1 and 2.

The contact formation, i.e., the formation of the through-via 12, is achieved in particular by melting the connecting stacks S, especially by melting the solder materials gold and tin. Here, the shape of the respective connecting stack S can change from a cylindrical shape to a drop shape, wherein the height of the respective connecting stack S can exceed the common interface G12, as a result of which a through-via 12 is formed between the first component part 1 and the second component part 2. The through-via 12 thus establishes an electrical connection between the first component part 1 and the second component part 2.

Depending on the filling quantity and the geometries of the openings 1IC and 2IC, the through-via 12 can have a positive or a negative curvature. Excess solder material can be accommodated in the lateral intermediate space between the through-via 12 and the inner walls of the common cavity 12K. The intermediate space can be formed, inter alia, by removing the material of the insulation layer/s 1I and/or 2I. Thus, no force can be exerted on the planar bond connection, in particular on the direct bond connection, during the formation of the through-via 12 which could lead to a detachment of the insulation layers 1I and 2I.

Figure 1G:
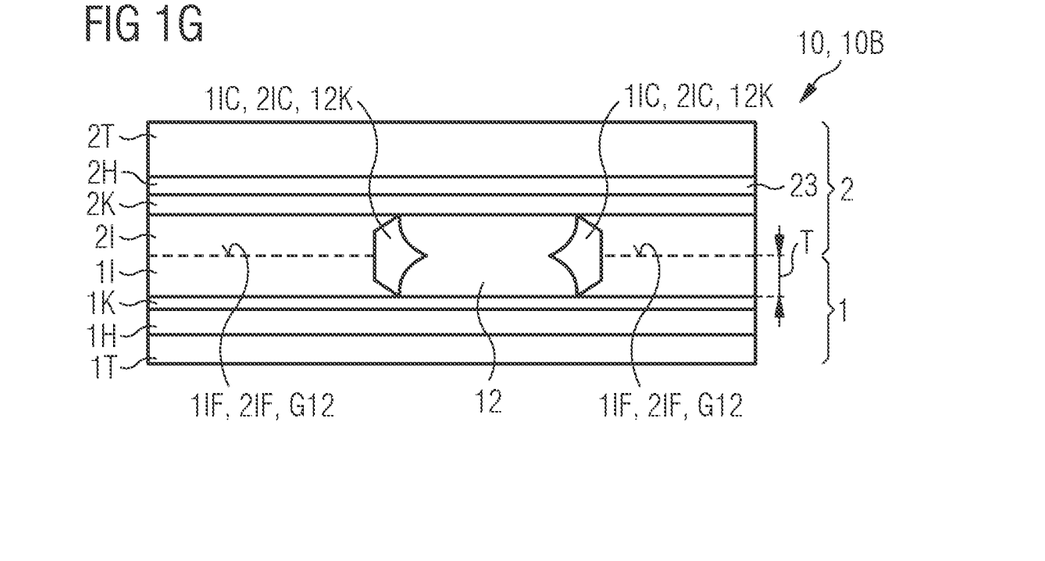

FIG. 1G schematically shows an assembly 10 made of component parts 1 and 2 or a component 10 or 10B made of component parts 1 and 2. The through-via 12 electrically connecting the component parts 1 and 2 is formed in particular by melting the connecting stack S or the connecting stacks S. As shown in FIG. 1G, even after the formation of the through-via 12, there is still an intermediate space in the lateral direction between the through-via 12 and the insulation layers 1I and 2I. In particular, the through-via 12 is a one-piece construction. In particular, the through-via 12 is formed from a gold-tin eutectic. The gold-tin eutectic may contain traces of materials of the barrier layer S3 or of a protective layer. In particular, the through-via 12 may contain traces of other metals such as copper, nickel, titanium or aluminum.

Figure 2A:
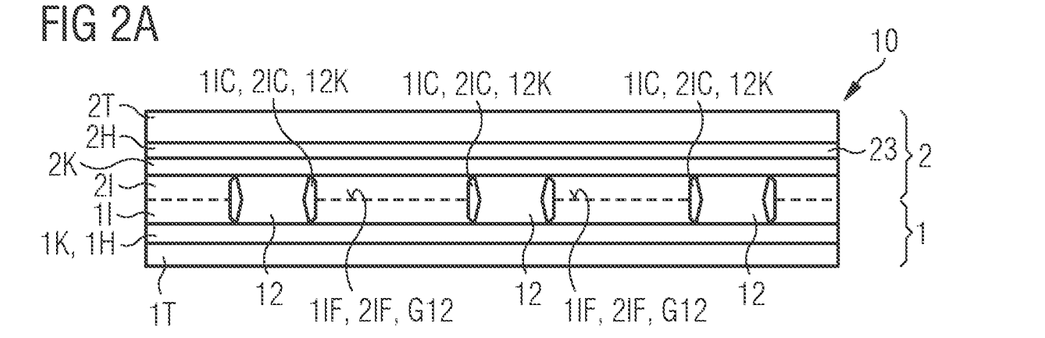
FIGS. 2A and 2B show schematic illustrations of some method steps of a further exemplary embodiment of a method for establishing a mechanical and electrical connection between the component parts.

The exemplary embodiment of an assembly 10 or of a component 10 made of the component parts 1 and 2 shown in FIG. 2A is essentially the same as the exemplary embodiment of an assembly 10 or a component 10 or 10B shown in FIG. 1G. In contrast, FIG. 2A shows a plurality of through-vias 12, wherein each of the through-via 12 is formed in a common cavity 12K. In the lateral directions, the through-vias 12 are spatially separated from each other. The through-vias 12 are completely enclosed in lateral directions by the first insulation layer 1I and/or by the second insulation layer 2I.

As shown in FIG. 2A, the through-via 12 only partially fills its associated cavity 12K. In particular, there are intermediate spaces between the through-via 12 and the inner walls of the cavity 12K. The intermediate spaces can be filled with a gaseous medium such as air. The through-via 12 can have a drop shape in places. The through-via 12 has side surfaces that can have a positive curvature some areas and/or a negative curvature in other areas. The through-via 12 can have the shape of a hyperboloid. In sectional view, the through-via 12 can be cylindrical in shape comprising side surfaces having either positive or negative curvature. The through-vias 12 can be assigned to the same electrical polarity of the component 10 or 10B or different electrical polarities of the component 10 or 10B.

As shown in FIGS. 1G and 2A, the common interface G12 between the insulation layers 1I and 2I is particularly planar. The common interface G12 has openings 12K, especially in the areas of the common cavities. The common interface surface 12 is formed in particular by the overlapping areas of the surfaces 1IF and 2IF of the insulation layers 1I and 2I.

Figure 2B:
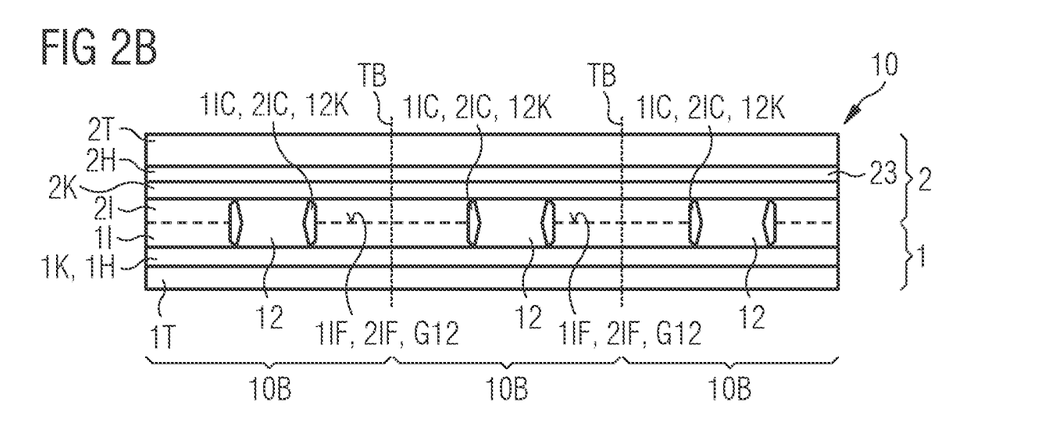

The exemplary embodiment of an assembly 10 or a component 10 shown in FIG. 2B essentially corresponds to the exemplary embodiment of an assembly 10 or a component 10 made of component parts 1 and 2 shown in FIG. 2A. As indicated in FIG. 2B, the assembly 10 can be separated from component parts 1 and 2 into a plurality of smaller components 10B. For example, the assembly 10 is separated into a plurality of individual components 10B at the separation lines TB. The individual component 10B is thus a subset of the assembly 10. The individual component 10B can have a single carrier from the first component part 1 and a single main body, particularly a radiation-active main body, from the component part 2. The carrier is electrically conductively connected to the main body of the individual component 10B via the through-via 12.

Figure 3A:
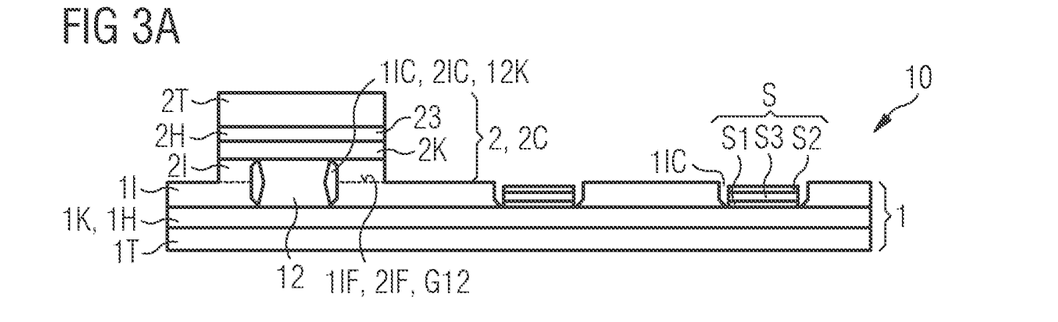
FIGS. 3A, 3B and 3C show schematic illustrations of some further method steps of a further exemplary embodiment of a method for producing a component or an assembly of component parts.
Figure 3B:
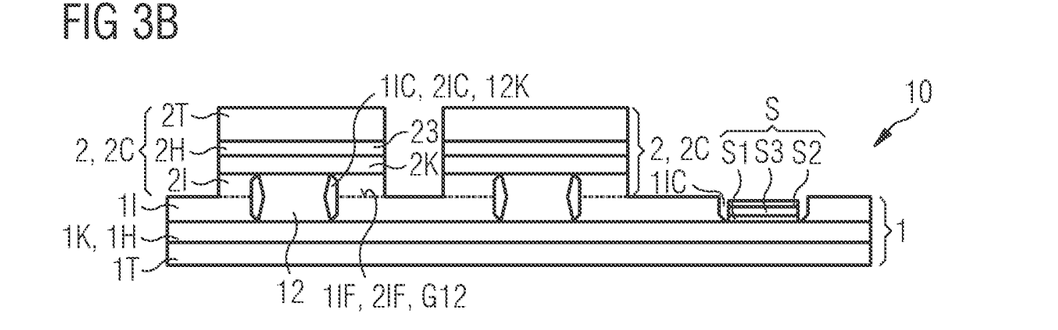

The exemplary embodiment shown in FIG. 3A for a method of establishing a connection between the component parts 1 and 2 essentially corresponds to the exemplary embodiments shown in FIGS. 1F, 1G and 2A. In contrast, the second component part 2 in FIG. 3A is formed as a single component part, for instance as a semiconductor chip 2C. In particular, the semiconductor chip 2C has a main body 2H having a radiation-active layer 23. The first component part 1 is formed in particular as a carrier for the semiconductor chip 2C or for a plurality of semiconductor chips 2C. The semiconductor chips 2C can be applied onto the component part 1 either simultaneously or successively, wherein the mechanical and electrical connection between the component part 1 and the component part 2, which in this case is formed as a semiconductor chip 2C, can be carried out analogously to the exemplary embodiments shown in FIGS. 1F and 1G. This is illustrated, for example, in FIGS. 3B and 3C.

Figure 3C:
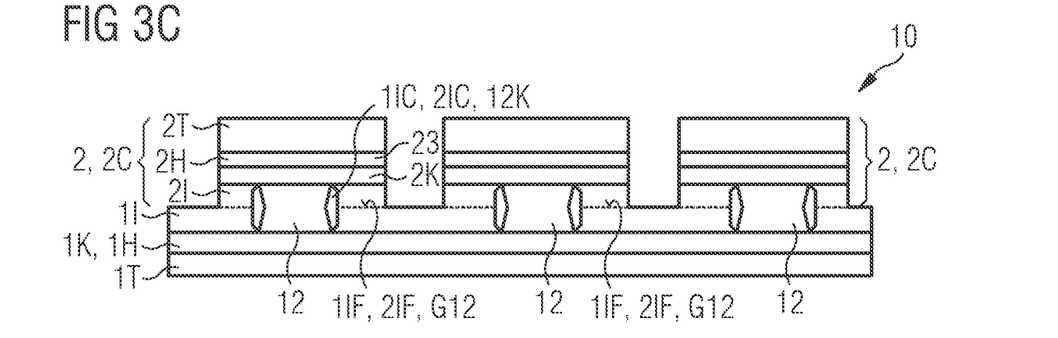

According to FIG. 3C, the assembly 10 or the component 10 has a common component part 1 and a plurality of second component parts 2. The second component parts 2, which are in particular semiconductor chips 2C, are mechanically contacted side by side on the common component part 1 and electrically connected to it. Each of the component parts 2 can have a second insulation layer 2I. The mechanical connection between the first component part 1 and the second component parts 2 can be established either successively or simultaneously. Via through-vias 12, the electrical connections between the first component part 1 and the second component parts 2 can also be established simultaneously or consecutively. As shown in FIG. 3C, the second component part 2, in particular the semiconductor chips 2C, are arranged side by side on the first component part 1. In particular, the second component parts 2 can be individually electrically contacted via the through-vias 12 and can thus be individually controlled.

In FIGS. 4A to 4I, further method steps for providing a first component part 1 and/or a second component part 2 are shown schematically in sectional views.

Figure 4A:
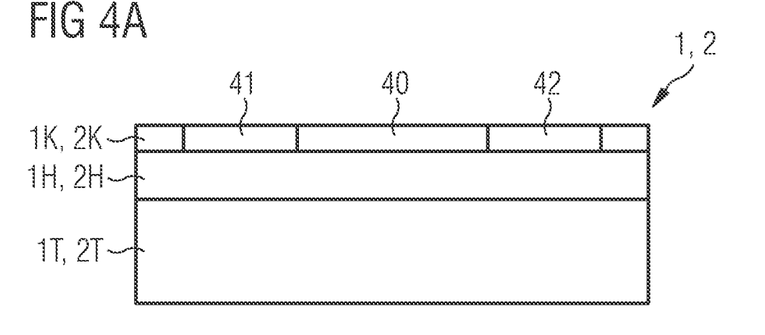
FIGS. 4A, 4B, 4C, 4D, 4E, 4F, 4G, 4H and 4I show schematic illustrations of some method steps of a further exemplary embodiment of a method for establishing a mechanical and electrical connection between the component parts.

The exemplary embodiment shown in FIG. 4A essentially corresponds to the exemplary embodiment shown in FIG. 1A, but initially without the insulation layer 1I or 2I. In contrast, FIG. 4A shows the contact structure 1K or 2K in more detail. The contact structure 1K or 2K can have contact layers 41 and 42. The contact layers 41 and 42 are especially configured for electrically contacting the main body 1H or 2H. The contact structure 1K or 2K can have a separating layer 40 which electrically isolates the contact layer 41 from the other contact layer 42.

The first component part 1 can have a silicon carrier 1T. The second component part 2 can have a carrier 2T, which is a growth substrate, on which the main body 2H, which is in particular a semiconductor body and/or has an LED structure, can be grown epitaxially. For example, the growth substrate is a sapphire substrate. The semiconductor body can be based on gallium nitride. In particular, the semiconductor body has a radiation-active layer, wherein the contact layers 41 and 42 are configured for electrically contacting the semiconductor body.

Figure 4B:
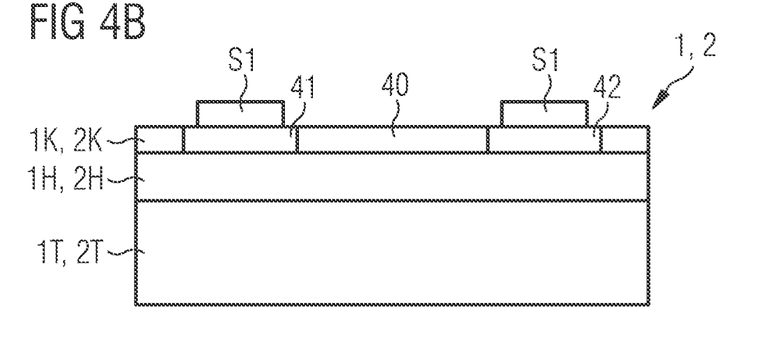

According to FIG. 4B, a first layer S1 of the connecting stack S is formed. The first layer S1 can be a gold layer or a tin layer. The first layer S1 can first be applied onto the 1K or 2K contact structure in a widespread and flat manner and then structured such that the first layer S1 only remains in the areas of the contact layers 41 and 42. Alternatively, it is possible to apply the first layer S1 in a structured manner onto the contact layers 41 and 42.

Figure 4C:
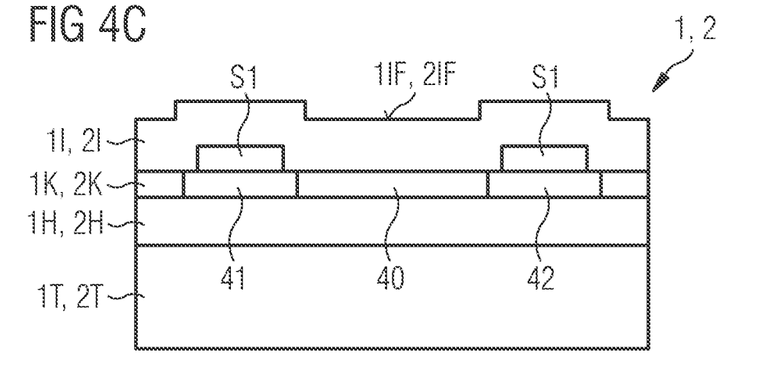

According to FIG. 4C, the insulation layer 1I or 2I is applied onto the first layer S1 and/or onto the contact structure 1K or 2K. The insulation layer 1I or 2I has a surface 1IF or 2IF facing away from the main body 1H or 2H, which has vertical elevations, especially in the areas of the first layer S1, especially in the form of steps. In top view, the insulation layer 1I or 2I covers the first layer S1 and/or the contact layers 41 and 42 in particular completely.

Figure 4D:
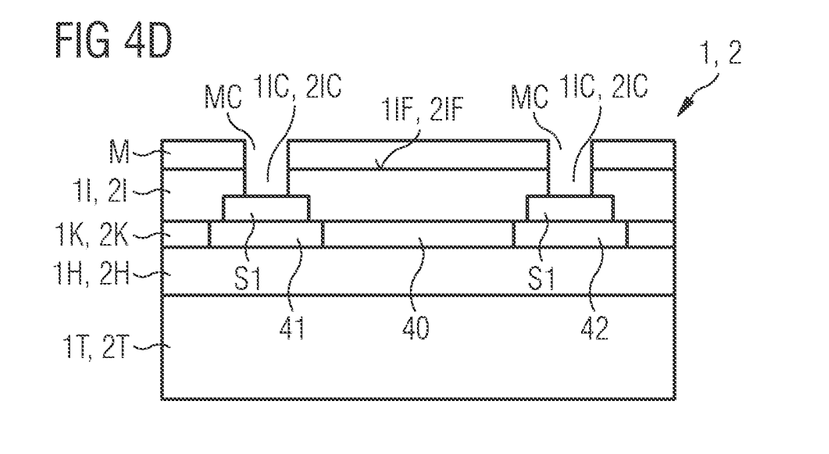

According to FIG. 4D, a plurality of openings 1IC or 2IC are formed in the insulation layer 1I or 2I by means of a mask M which is formed in particular from a photo-structurable resist layer. In the openings 1IC and 2IC, the first layer S1 is exposed in places. Before the openings 1IC and 2IC are formed, the insulation layer 1I or 2I can be planarized, for example, using a chemical-mechanical planarization process. The insulation layer 1I or 2I is preferably formed from silicon oxide, especially from silicon dioxide.

Figure 4E:
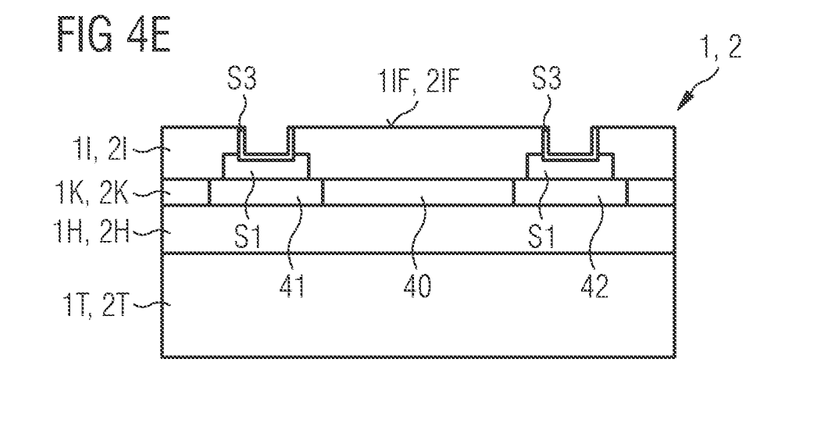

According to FIG. 4E, a barrier layer S3 is formed at least in the areas of the openings 1IC and/or 2IC. The barrier layer S3 can cover, in particular completely cover a bottom surface and inner walls of the openings 1IC or 2IC. The bottom surface of the opening or openings 1IC and 2IC is formed in particular by a surface of the first layer S1. The barrier layer S3 may be directly adjacent to the first layer S1. The barrier layer S3 may be formed of titanium or platinum. For example, the barrier layer S3 has a vertical layer thickness between 1 nm and 30 nm inclusive, for instance between 1 nm and 20 nm, preferably between 1 nm and 10 nm.

Figure 4F:
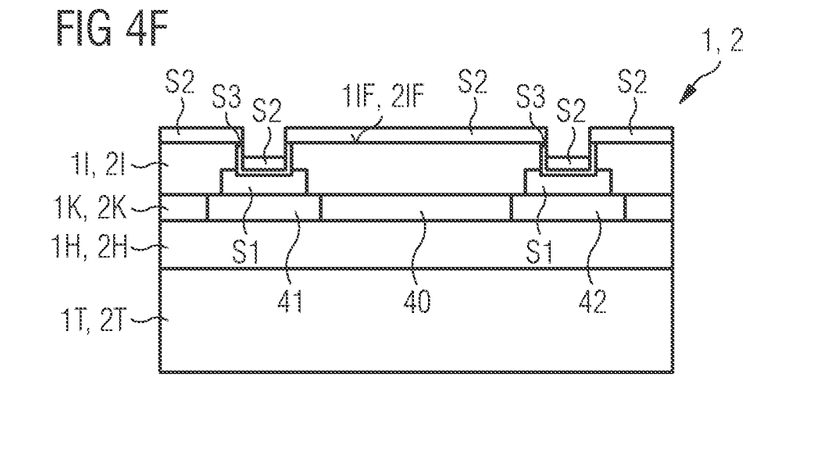

According to FIG. 4F, a second layer S2 of the connecting stack S is formed. In particular, the second layer S2 is applied by a sputtering process onto the insulation layer 1I or 2I and onto the barrier layer S3. For example, a layer thickness of the second layer S2 is chosen such that the second layer S2 only partially fills the openings 1IC or 2IC of the insulation layer 1I or 2I. The second layer S2 is preferably formed of tin or gold. At least in the areas of the openings 1IC and 2IC of the insulation layer 1I or 2I, the barrier layer S3 is located in the vertical direction between the first layer S1 and the second layer S2.

Figure 4G:
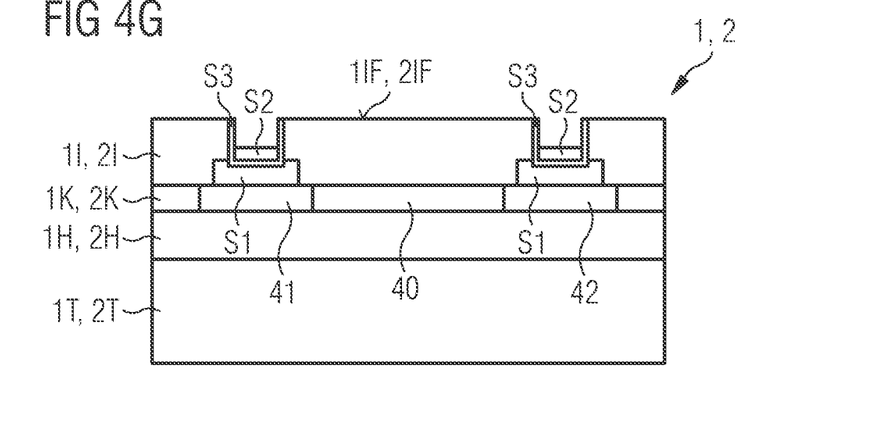

According to FIG. 4G, outside the openings of the insulation layer 1I or 2I, the second layer S2 is removed.

Figure 4H:
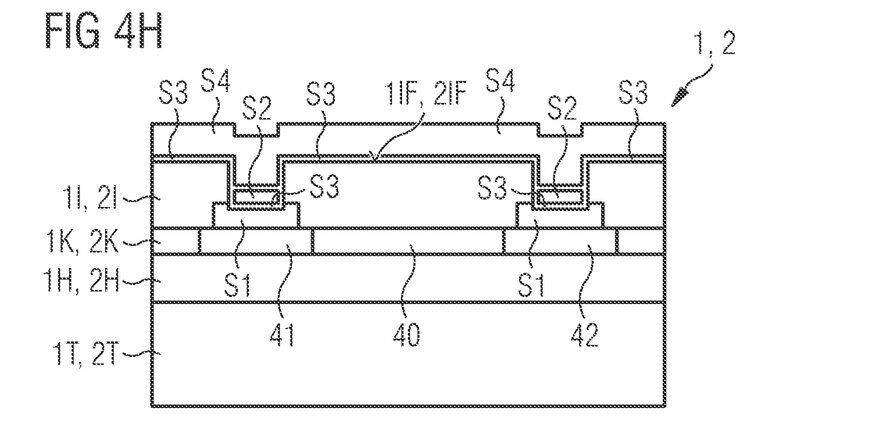

After partially removing the second layer S2, a further barrier layer S3 is applied onto the insulation layer 1I or 2I and the second layer S2 as shown in FIG. 4H. In a subsequent method step, a protective layer S4 is applied, in particular in a widespread and flat manner, onto the further barrier layer S3 or onto the insulation layer 1I or 2I. The protective layer S4 can be formed from nickel, copper, aluminum or from a material whose hardness is in particular higher than that of the material of the first layer S1 and/or of the second layer S2. In particular, the protective layer S4 may be made of gold.

Figure 4I:
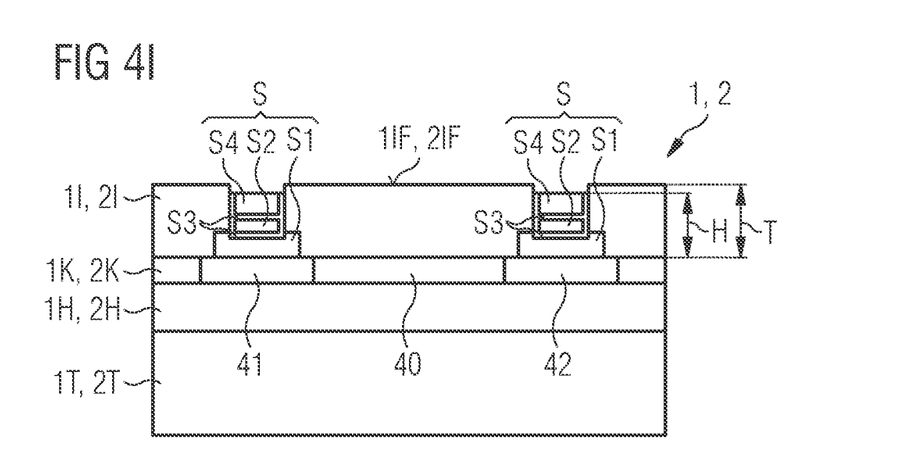

According to FIG. 4I, the insulation layer 1I or 2I is planarized. During this process the protective layer S4 is partially removed. In particular outside the openings 1IC and 2IC, the protective layer S4 is completely removed, thus exposing the insulation layer 1I or 2I. Prior to the planarization process, the protective layer S4 completely fills the opening or the openings 1IC or 2IC. After the planarization process, the openings 1IC or 2IC are only partially filled by the protective layer S4. In other words, the protective layer S4 is slightly retracted from the surface 1IF, 2IF in the areas of the openings of the insulation layer 1I or 2I. For example, the protective layer S4 is retracted from the surface 1IF, 2IF by a distance between 1 nm and 1 μm inclusive, preferably between 1 nm and 500 nm, for instance between 1 nm and 100 nm inclusive or between 10 nm and 50 nm inclusive.

For the direct bonding process and for the formation of the through-via 12, it is crucial that a predetermined distance from the protective layer 4 to the particularly planarized surface 1IF or 2IF is maintained. If the distance is too small or if the protective layer S4, i.e., the connecting stack S, protrudes beyond the surface 1IF or 2IF, direct bonding cannot be reliably carried out. The direct bond connection can also be damaged due to its increase in volume when the connecting stack S is heated. If the distance between the protective layer S4 and the surface 1IF or 2IF is too large, there is a risk that the through-via 12 will not be formed continuously. In general, it is preferable that the distance between the protective layer S4 and the surface 1IF or 2IF be maintained at for instance 30 nm±10 nm. The challenge is, among other things, to achieve this distance reliably and reproducibly for all connecting stacks S of the first component part 1 and/or the second component part 2, if possible.

It has been found that such an exact distance can be set very accurately in a planarization process having protective layer 4. On the other hand, gold and tin are much softer than a material of the protective layer S4, e.g., of nickel, and are therefore not particularly suitable for forming the top layer of the connecting stack S.

As shown in FIG. 4I, the second layer S2 in the corresponding opening of the insulation layer 1I or 2I is completely enclosed by the barrier layer S3. The barrier layer S3 is located in particular in the vertical direction between the first layer S1 and the second layer S2. In places, the barrier layer S3 is located in the vertical direction between the second layer S2 and the protective layer S4. The barrier layer S3 can thus prevent an early reaction, such as an intermetallic diffusion, between the layers S1 and S2 and/or between the layers S2 and the protective layer S4.

Figure 5A:
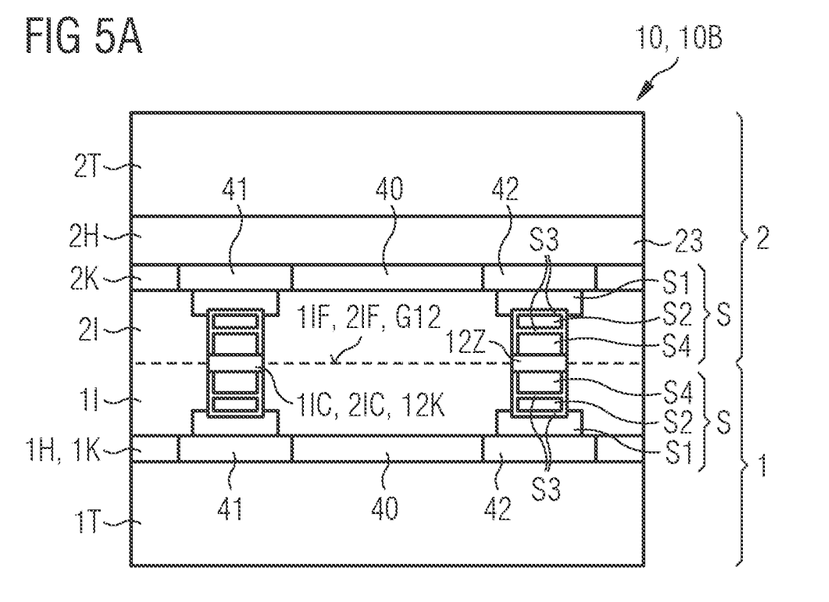
FIGS. 5A, 5B, 6A and 6B show schematic illustrations of some further method steps of a further exemplary embodiment of a method for producing an assembly or a component made of a plurality of component parts.

The exemplary embodiment shown in FIG. 5A essentially corresponds to the exemplary embodiment shown in FIG. 1F, wherein the first component part 1 and the second component part 2 are joined together to produce an assembly 10 or a component 10 or 10B. In particular, a mechanical connection between the component parts 1 and 2 is achieved by a direct bonding process. The openings 1IC and 2IC of the insulation layers 1I and 2I can form a common, in particular sealed cavity 12K. Even after the mechanical connection between the component parts 1 and 2 has been established, there may still be an intermediate space 12Z between the connecting stacks S in the common cavity 12K.

Figure 5B:
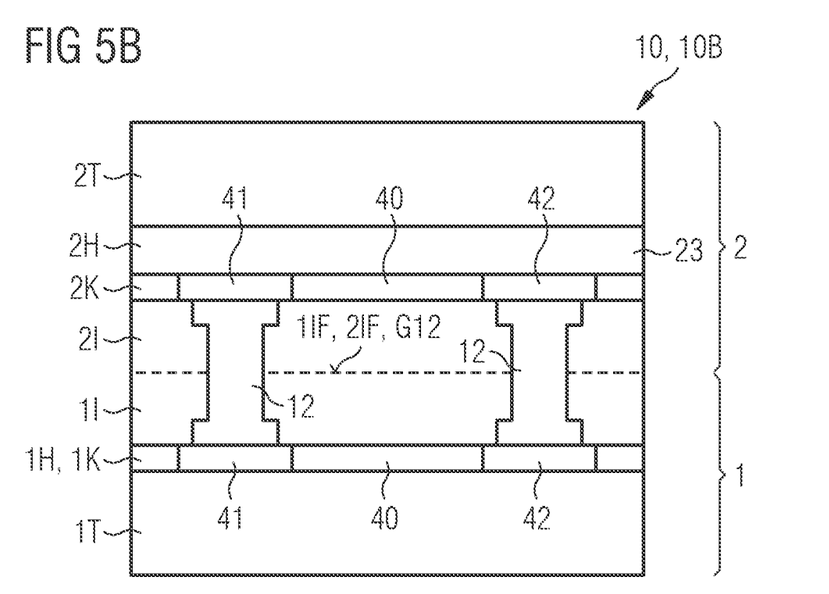

After the mechanical fixation of the component parts 1 and 2, an annealing step can be carried out, wherein the connecting stacks S are melted to form the through-via 12 or the plurality of through-vias 12. The exemplary embodiment shown in FIG. 5B is essentially the same as the exemplary embodiment shown in FIG. 1G. In particular, the through-via 12 is gold-tin eutectic formed in one piece. The gold-tin eutectic may contain traces of materials of the barrier layer S3 and/or of the protective layer S4. In contrast to the exemplary embodiment shown in FIG. 1G, the through-via 12 can completely fill the common cavity 12K as shown in FIG. 5B.

Figure 6A:
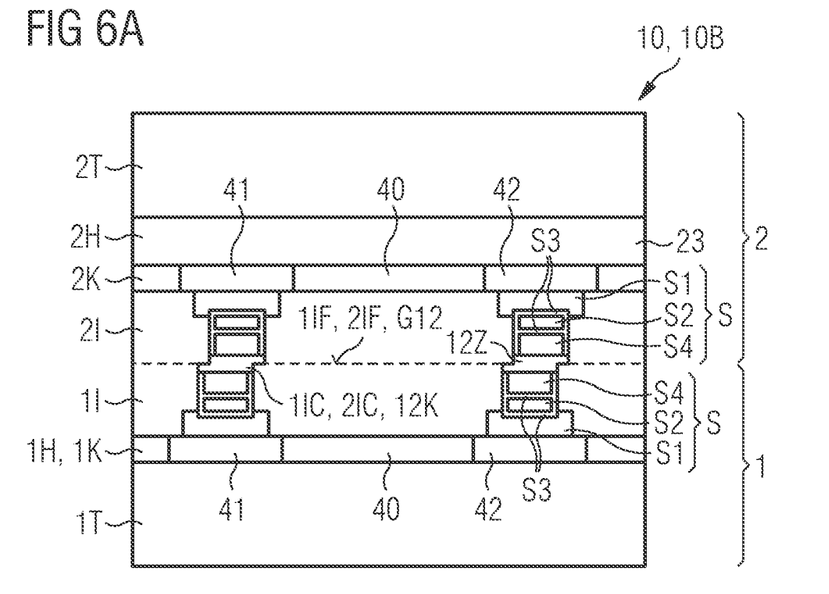
Figure 6B:
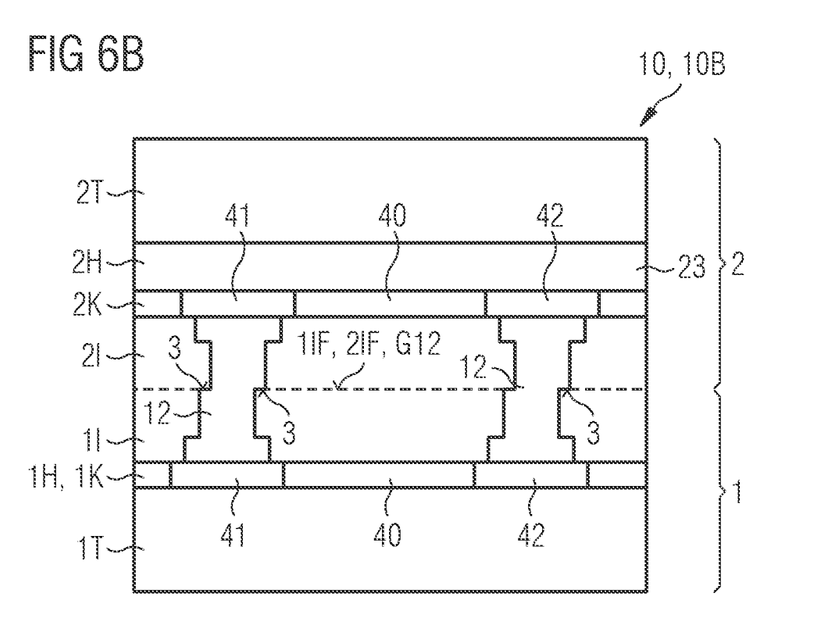

The exemplary embodiments shown in FIGS. 6A and 6B essentially correspond to the exemplary embodiments shown in FIGS. 5A and 5B for establishing a mechanical and electrical connection between the component parts 1 and 2. In contrast, FIG. 6A shows that the first insulation layer 1I and the second insulation layer 2I can have steps 3 or jumps 3 at the common interface G12, especially in the areas of the common cavities 12K. Such steps 3 or jumps 3 can be regarded as characteristic features of a so-called hybrid direct bonding process. Such steps 3 or jumps 3 at the common interface G12 can also be seen in particular on the side faces of the through-via 12 or on the side faces of the through-vias 12, as shown for example in FIG. 6B.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

The invention claimed is:
1. A component comprising:
a first component part;
a second component part; and
a through-via,
wherein the first component part has a first insulation layer and the second component part has a second insulation layer, wherein the through-via is an AuSn alloy and electrically conductively connects the first component part to the second component part, wherein the through-via is arranged in a first opening of the first insulation layer and in a second opening of the second insulation layer and is completely enclosed in lateral directions by both the first insulation layer and the second insulation layer, wherein the through-via is an AuSn eutectic which is formed in one piece, and wherein the through-via comprises side surfaces which along a vertical direction, have a positive curvature in some areas and a negative curvature in other areas, and wherein a plurality of second component parts comprises semiconductor chips fixed side by side on the first component part.

2. The component according to claim 1, wherein the first component part is a radiation-inactive carrier wafer and the second component part is a semiconductor wafer comprising a radiation-active layer.

3. The component according to claim 1, wherein the first component part is a radiation-inactive carrier wafer and the second component part is a semiconductor chip.

4. The component according to claim 1, wherein the first insulation layer and the second insulation layer comprise $SiO_2$.

5. The component according to claim 1, wherein the openings form a common closed cavity, and wherein, at least in places, the cavity has a larger lateral extent than the through-via so that the through-via only partially fills the cavity.

6. The component according to claim 1, wherein the AuSn eutectic comprises traces of Cu, Ni, Ti and/or Al.

7. The component according to claim 1, wherein the through-via has a drop shape in places or the shape of a hyperboloid.

8. The component according to claim 1, wherein, in a sectional view, the through-via is cylindrical in shape, and wherein the side surfaces have the positive curvature.

9. The component according to claim 1, wherein, in a sectional view, the through-via is cylindrical in shape, and wherein the side surfaces have the negative curvature.

10. A component comprising:
a first component part;
a second component part; and
a through-via, wherein the first component part has a first insulation layer and the second component part has a second insulation layer, wherein the through-via is an AuSn alloy and electrically conductively connects the first component part to the second component part, wherein the through-via is arranged in a first opening of the first insulation layer and in a second opening of the second insulation layer, and is completely enclosed in lateral directions by both the first insulation layer and the second insulation layer, wherein the through-via is an AuSn eutectic which is formed in one piece, wherein the first and second openings form a common closed cavity, wherein, at least in places, the common closed cavity has a larger lateral extent than the through-via so that the through-via only partially fills the common closed cavity, wherein intermediate spaces are located between the through-via and inner walls of the common closed cavity, the intermediate spaces being filled with a gaseous medium, wherein the first insulation layer and the second insulation layer comprise $SiO_2$, wherein the first insulation layer and the second insulation layer form a common interface, the common interface being free of a connecting material, and wherein side surfaces of the through-via have a positive curvature in some areas and a negative curvature in other areas.

11. The component according to claim 10, wherein the intermediate spaces are filled with air.

12. The component according to claim 10, wherein the through-via comprises side surfaces, which along a vertical direction, have a positive curvature or a negative curvature.

13. The component according to claim 10, wherein the through-via has a hyperboloid shape.

14. The component according to claim 10, wherein, in sectional view, the through-via is cylindrical in shape comprising side surfaces having either positive curvature or a negative curvature.

15. The component according to claim 10, wherein the first insulation layer and the second insulation layer have steps or jumps at the common interface.

* * * * *